United States Patent
Li et al.

(10) Patent No.: US 11,959,976 B2
(45) Date of Patent: Apr. 16, 2024

(54) DC CONVERTER VALVE STATE DETECTION METHOD BASED ON TEMPORAL FEATURES OF CONVERTER TERMINAL CURRENTS

(71) Applicant: South China University of Technology, Guangzhou (CN)

(72) Inventors: Xiaohua Li, Guangzhou (CN); Shanshan Yin, Guangzhou (CN); Jiewen Li, Guangzhou (CN)

(73) Assignee: South China University of Technology (CN)

( * ) Notice: Subject to any disclaimer, the term of this patent is extended or adjusted under 35 U.S.C. 154(b) by 90 days.

(21) Appl. No.: 17/761,729

(22) PCT Filed: Jan. 15, 2021

(86) PCT No.: PCT/CN2021/071988
§ 371 (c)(1),
(2) Date: Mar. 18, 2022

(87) PCT Pub. No.: WO2021/147772
PCT Pub. Date: Jul. 29, 2021

(65) Prior Publication Data
US 2022/0397615 A1 Dec. 15, 2022

(30) Foreign Application Priority Data
Jan. 21, 2020 (CN) .......................... 202010069208.4

(51) Int. Cl.
*G01R 31/56* (2020.01)
*H02J 3/36* (2006.01)

(52) U.S. Cl.
CPC ............... *G01R 31/56* (2020.01); *H02J 3/36* (2013.01)

(58) Field of Classification Search
CPC .. G01R 31/56; G01R 31/263; G01R 31/3275; G01R 31/42; G01R 31/00; H02J 3/36;
(Continued)

(56) References Cited

FOREIGN PATENT DOCUMENTS

| CN | 101187690 A | 6/2008 |
| CN | 101452045 A | 6/2009 |

(Continued)

OTHER PUBLICATIONS

B.L. Sheng et al., "A new synthetic test circuit for the operational tests of HVDC thyristor modules," APEC 2001, Sixteenth Annual IEEE Applied Power Electronics Conference and Exposition (Cat. No. 01CH37181), Anaheim, CA, USA, 2001, pp. 1242-1246 vol. 2, doi: 10.1109/APEC.2001.912524. (Year: 2001).*

(Continued)

*Primary Examiner* — Tung X Nguyen
*Assistant Examiner* — Robert P Alejnikov, Jr.
(74) *Attorney, Agent, or Firm* — Eschweiler & Potashnik, LLC (57) ABSTRACT

The present invention discloses a DC converter valve state detection method based on temporal features of converter terminal currents, including the following steps: collecting three-phase AC currents on a converter valve-side of a DC transmission system; defining a current when the currents of two commutating valves are equal as a base value, greater than the base value as a valve conducting current, and less than the base value as a valve blocking current; constructing a valve conducting state by a relative relationship among amplitudes of the three-phase AC currents, and calculating a time interval of each valve conducting state; comparing time intervals of 6 valve conducting states with a time interval of a valve conducting state in normal operation, and determining whether the 6 valve states are normal according to the result of comparison and locating all abnormal valves.

(Continued)

The present invention can reliably detect valve states and locate abnormal valves through sequence detection. This method can be applied to actual fault phase judgment and commutation failure judgment, providing a good support for accurate judgment of DC control and protection.

4 Claims, 4 Drawing Sheets

(58) Field of Classification Search
CPC .... H02M 1/0009; H02M 1/32; H02M 7/7575; Y02E 60/60
USPC ........................................................ 324/537
See application file for complete search history.

(56) References Cited

FOREIGN PATENT DOCUMENTS

| | | | |
|---|---|---|---|
| CN | 101674023 A | * | 3/2010 |
| CN | 101752873 A | | 6/2010 |
| CN | 102353874 A | | 2/2012 |
| CN | 103065016 A | | 4/2013 |
| CN | 103488883 A | | 1/2014 |
| CN | 103713249 A | | 4/2014 |
| CN | 103728506 A | * | 4/2014 |
| CN | 103744017 A | | 4/2014 |
| CN | 203759149 U | | 8/2014 |
| CN | 104267288 A | | 1/2015 |
| CN | 104764991 A | | 7/2015 |
| CN | 104993493 A | * | 10/2015 |
| CN | 107942181 A | | 4/2018 |
| CN | 108152680 A | | 6/2018 |
| CN | 110378020 A | | 10/2019 |
| CN | 111157827 A | | 5/2020 |
| KR | 101222654 B1 | | 1/2013 |
| KR | 101264743 B1 | | 5/2013 |
| WO | 2016112976 A1 | | 7/2016 |
| WO | WO-2019011080 A1 * | 1/2019 | ......... G01R 31/2601 |

OTHER PUBLICATIONS

International Search Report dated Apr. 19, 2021 for International Application No. PCT/CN2021/071988.

* cited by examiner

DC CONVERTER VALVE STATE DETECTION METHOD BASED ON TEMPORAL FEATURES OF CONVERTER TERMINAL CURRENTS

CROSS-REFERENCE TO RELATED APPLICATIONS

This Application is a National Phase Entry of PCT/CN2021/071988, filed on Jan. 15, 2021, which claims priority to Chinese Application number 202010069208.4, filed on Jan. 21, 2020. The contents of the above-referenced Patent Applications are hereby incorporated by reference in their entirety.

TECHNICAL FIELD

The present invention relates to the technical field of HVDC transmission, and in particular to a DC converter valve state detection method based on temporal features of converter terminal currents.

BACKGROUND

When an AC fault occurs or the converter is in abnormal operation, the characteristics of the valve conducting state will change, which directly threatens the safe operation of the valve. In order to ensure the safety of the converter valve, the system is equipped with corresponding protection of converters. At present, due to the process design of equipment such as heat dissipation and insulation, measuring components cannot be installed inside a converter valve to measure the valve current in actual grid DC transmission project, resulting in that the operating state of the valve cannot be directly detected. The three-phase AC electrical quantity and DC electrical quantity outside the valve can be measured by the current transformers of converter terminal. Hence, converter protection uses the amplitude characteristics of the electrical quantities on both sides of the converter terminal for judgment in the HVDC transmission system. Such a solution of merely uses the amplitude characteristics of external electrical quantity for detection, which inevitably has a mismatch in valve state judgment. In field, there are a large number of accidents with unreasonable DC protection action, which indicates the insufficient sensitivity and rapidity of protection. Therefore, from the perspective of reflecting the characteristics of the valve conducting state, it is particularly necessary to find the relationship between the valve conducting state and the temporal features for accurately judging whether the valve conducting state is normal.

SUMMARY

An objective of the present invention is to provide a DC converter valve state detection method based on temporal features of terminal currents to solve the above defects in the prior art.

The objective of the present invention can be achieved by adopting the following technical solutions:

A DC converter valve state detection method based on temporal features of terminal currents, comprising the following steps:

S1. defining a HVDC transmission converter valve model, comprising a valve $VT_1$, a valve $VT_2$, a valve $VT_3$, a valve $VT_4$, a valve $VT_5$, and a valve $VT_6$, wherein the valve $VT_1$ and the valve $VT_4$ are connected in series to form a first branch, the valve $VT_3$ and the valve $VT_6$ are connected in series to form a second branch, the valve $VT_5$ and the valve $VT_2$ are connected in series to form a third branch, and the first, second, and third branches are connected in parallel, and wherein a connecting point between the valve $VT_1$ and the valve $VT_4$ in the first branch is defined as an a-phase measuring point of three-phase AC currents, a connecting point between the valve $VT_3$ and the valve $VT_6$ in the second branch is defined as a b-phase measuring point of the three-phase AC currents, a connecting point between the valve $VT_5$ and the valve $VT_2$ in the third branch is defined as a c-phase measuring point of the three-phase AC currents, and three-phase AC currents $i_a$, $i_b$ and $i_c$ on a converter valve-side of a DC transmission system are collected, where $i_a$, $i_b$ and $i_c$ represent an a-phase, a b-phase, and a c-phase of the three-phase AC currents respectively;

S2. defining a current when the currents of two commutating valves are equal as a base value, greater than the base value as a valve conducting current, and less than the base value as a valve blocking current;

S3. defining sequence detection, wherein the logic is as follows: a valve current relative relationship is constructed by a ratio of the valve conducting current to the valve current base value, when a duty cycle of the valve current relative relationship is greater than a threshold, it is defined as a valve conducting state, and the valve conducting state is integrated within one cycle to construct a valve conduction time interval; and S4. according to the steps S2 and S3, comparing time intervals of valve conducting states of the valve $VT_1$, the valve $VT_2$, the valve $VT_3$, the valve $VT_4$, the valve $VT_5$, and the valve $VT_6$ with a time interval of a valve conducting state in normal operation, and determining whether the valve state is normal and locating an abnormal valve according to the result of comparison.

Further, the step S2 includes:

S21. obtaining valve currents $i_{VT1}$, $i_{VT2}$, $i_{VT3}$, $i_{VT4}$, $i_{VT5}$ and $i_{VT6}$ of the valve $VT_1$, the valve $VT_2$, the valve $VT_3$, the valve $VT_4$, the valve $VT_5$, and the valve $VT_6$ by calculating absolute values of the three-phase AC currents $i_a$, $i_b$ and $i_c$ according to the following formula:

$$\begin{cases} i_{VT1} = |i_a|; i_a < 0 \\ i_{VT2} = |i_c|; i_c > 0 \\ i_{VT3} = |i_b|; i_b < 0 \\ i_{VT4} = |i_a|; i_a > 0 \\ i_{VT5} = |i_c|; i_c < 0 \\ i_{VT6} = |i_b|; i_b > 0 \end{cases} \quad (1)$$

where $i_{VT1}$ is the valve current of the valve $VT_1$, $i_{VT2}$ is the valve current of the valve $VT_2$, $i_{VT3}$ is the valve current of the valve $VT_3$, $i_{VT4}$ is the valve current of the valve $VT_4$, $i_{VT5}$ is the valve current of the valve $VT_5$, and $i_{VT6}$ is the valve current of the valve $VT_6$;

S22. calculating the maximum value of the absolute values of the three-phase AC currents $i_a$, $i_b$ and $i_c$ as the valve current base value according to the following formula:

$$i_{base} = \frac{\max(|i_a|,|i_b|,|i_c|)}{2} \quad (2)$$

where $i_{base}$ represents the valve current base value, $|i_a|$, $|i_b|$ and $|i_c|$ represent the absolute values of the three-phase AC currents, and $\max(|i_a|,|i_b|,|i_c|)$ represents the maximum value of the absolute values of the three-phase AC currents; and S23. defining the valve current being greater than the valve current base value as the valve conducting current according to the following formula:

$$i_{HVTm}=i_{VTm}; i_{VTm} \geq i_{base} \quad (3)$$

where m=1、2、3、4、5、6, and $i_{HVTm}$ represents the valve conducting current.

Further, the step S3 includes:

S31. defining a ratio of the valve conducting current to the valve current base value as a valve current relative relationship $S_{VT1}$, $S_{VT2}$, $S_{VT3}$, $S_{VT4}$, $S_{VT5}$ and $S_{VT6}$ according to the following formula:

$$S_{VTm} = \frac{i_{HVTm}}{i_{base}} \quad (4)$$

where $S_{VTm}$ represents the valve current relative relationship $S_{VT1}$, $S_{VT2}$, $S_{VT3}$, $S_{VT4}$, $S_{VT5}$ and $S_{VT6}$, m=1、2、3、4、5、6, $i_{HVTm}$ represents the valve current conducting state, and $i_{base}$ represents the valve current base value;

S32. calculating a valve current duty cycle of the valve current relative relationship $S_{VTm}$ through a single-phase comparator, and defining the valve current duty cycle being greater than K as the valve conducting state $S_{HVTm}$ according to the following formula:

$$S_{HVTm}=S_{VTm}; S_{VTm}>K \quad (5)$$

where $S_{HVTm}$ is the valve conducting state, and K is a critical value considering calculation errors; and S33. according to the step S32, calculating a valve conduction time interval of the valve conducting state in each power frequency cycle with an integrator according to the following formula:

$$t_{HVTm}=\int_{-T}^{0} S_{HVTm} dt \quad (6)$$

where $t_{HVTm}$ is the valve conduction time interval, and T is the time interval of a power frequency cycle.

Further, the step S4 includes:

S41. during normal operation, triggering the valve $VT_1$, the valve $VT_2$, the valve $VT_3$, the valve $VT_4$, the valve $VT_5$, and the valve $VT_6$ of the three-phase to conduct in turn at 60° equal phase intervals, and according to the steps S2 and S3, calculating a time interval of each valve conducting state in normal operation according to the following formula:

$$t_{HVT\_normal} = \frac{T}{3} \quad (7)$$

where $t_{HVT\_normal}$ is the valve conduction time interval in normal operation, and T is the time interval of a power frequency cycle;

S42. comparing the actual valve conduction time interval calculated in S33 with the valve conduction time interval in normal operation to determine whether each valve conducting state is abnormal according to the following formula:

$$\begin{cases} |t_{HVTm} - t_{HVT\_normal}| \leq \varepsilon; \text{ normal} \\ |t_{HVTm} - t_{HVT\_normal}| > \varepsilon; \text{ abnormal} \end{cases} \quad (8)$$

where $\varepsilon$ represents a sampling measurement error; and

S43. locating an abnormal valve according to an output state from the valve conduction time interval through a range comparator according to the following formula:

$$CS_{HVTm} = \begin{cases} 2; t_{HVTm} - t_{HVT\_normal} > \varepsilon \\ 1; -\varepsilon \leq t_{HVTm} - t_{HVT\_normal} \leq \varepsilon \\ 0; t_{HVTm} - t_{HVT\_normal} < -\varepsilon \end{cases} \quad (9)$$

where $cs_{HVTm}$ represents a valve state signal, 2 represents that the valve conducting state is lengthened, 1 represents that the valve conducting state is normal, and 0 represents that the valve conducting state is shortened.

Compared with the prior art, the present invention has the following advantages and effects:

The present invention provides a DC converter valve state detection method based on temporal features of converter terminal currents, which can reliably detect valve states and locate abnormal valves through sequence detection. This method can be applied to actual fault phase judgment and commutation failure judgment, providing a good support for accurate judgment of DC control and protection.

BRIEF DESCRIPTION OF THE DRAWINGS

represents the valve conduction time interval.

DETAILED DESCRIPTION

In order to make the objectives, technical solutions, and advantages of the embodiments of the present invention clearer, the technical solutions in the embodiments of the present invention will be described clearly and completely in conjunction with the accompanying drawings in the embodiments of the present invention. Obviously, the described embodiments are a part of the embodiments of the present invention, but not all of the embodiments. Based on the embodiments of the present invention, all other embodiments obtained by those of ordinary skill in the art without creative work shall fall within the protection scope of the present invention.

Embodiment I

Figure 1:
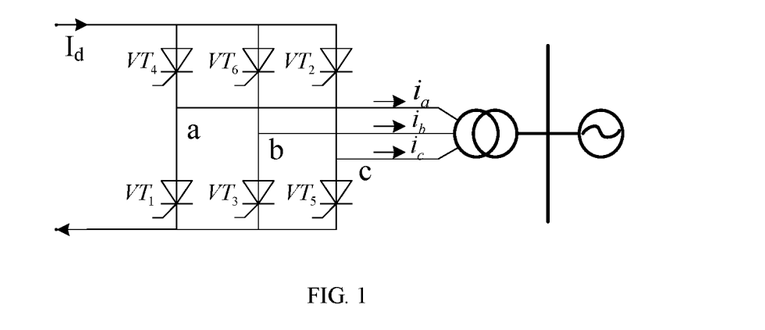
FIG. 1 is a schematic diagram of an HVDC transmission converter valve according to the present invention.

This embodiment provides a DC converter valve state detection method based on temporal features of converter terminal currents. The method is implemented through the following technical solutions and includes the following steps:

S1. An HVDC transmission converter valve model is as shown in FIG. 1, and three-phase AC currents $i_a$, $i_b$ and $i_c$ on a converter valve-side of a DC transmission system are collected.

Figure 2:
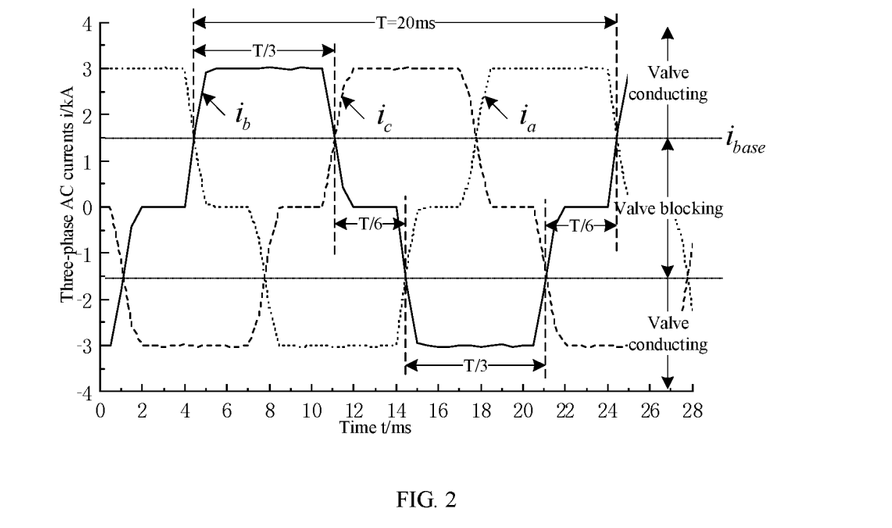
FIG. 2 is a waveform diagram of three-phase AC currents on the converter valve-side according to the present invention when the valve state is in normal operation, in which $i_a$, $i_b$ and $i_c$ represents phases a, b, and c of the three-phase AC currents, $i_{base}$ represents that the current when the currents of two commutating valves are equal, and $$\frac{T}{3}$$

S2. A current when the currents of two commutating valves are equal is defined as a base value $i_{base}$, greater than the base value $i_{base}$ as a valve conducting current, and less than the base value $i_{base}$ as a valve blocking current, as shown in FIG. 2;

The step S2 specifically includes the following steps:

S21. According to the step S1, 6 valve currents $i_{VT1}$, $i_{VT2}$, $i_{VT3}$, $i_{VT4}$, $i_{VT5}$ and $i_{VT6}$ are obtained by calculating absolute values of the three-phase AC currents $i_a$, $i_b$ and $i_c$ according to the following formula:

$$\begin{cases} i_{VT1} = |i_a|; i_a < 0 \\ i_{VT2} = |i_c|; i_c > 0 \\ i_{VT3} = |i_b|; i_b < 0 \\ i_{VT4} = |i_a|; i_a > 0 \\ i_{VT5} = |i_c|; i_c < 0 \\ i_{VT6} = |i_b|; i_b > 0 \end{cases} \quad (1)$$

where $i_{VT1}$ is the valve current of the valve $VT_1$, $i_{VT2}$ is the valve current of the valve $VT_2$, $i_{VT3}$ is the valve current of the valve $VT_3$, $i_{VT4}$ is the valve current of the valve $VT_4$, $i_{VT5}$ is the valve current of the valve $VT_5$, and $i_{VT6}$ is the valve current of the valve $VT_6$.

S22. The maximum value of the absolute values of the three-phase AC currents $i_a$, $i_b$ and $i_c$ is calculated as the valve current base value according to the following formula:

$$i_{base} = \frac{\max(|i_a|, |i_b|, |i_c|)}{2} \quad (2)$$

where $i_{base}$ as represents the valve current be value, $|i_a|$, $|i_b|$ and $|i_c|$ represent the absolute values of the three-phase AC currents, and $\max(|i_a|,|i_b|,|i_c|)$ represents the maximum value of the absolute values of the three-phase AC currents.

S23. The valve current being greater than the valve current base value is defined as the valve conducting current according to the following formula:

$$i_{HVTm} = i_{VTm}; i_{VTm} \geq i_{base} \quad (3)$$

where m=1、2、3、4、5、6, and $i_{HVTm}$ represents the valve conducting current.

Figure 3:
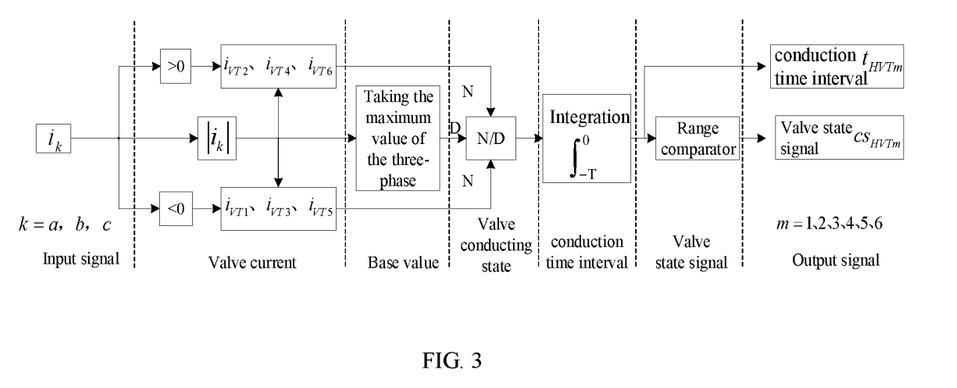
FIG. 3 is a logic diagram of sequence detection according to the present invention, in which $i_k$ represents collected currents of the three-phase AC currents on the converter valve-side, k=a、b、c, $t_{HVTm}$ represents the valve conduction time interval, $cs_{HVTm}$, represents the signal of valve conducting state, and m=1、2、3、4、5、6.

S3. Sequence detection is defined, and the logic is as shown in FIG. 3.

This step S3 specifically includes the following steps:

S31. A ratio of the valve conducting current to the valve current base value is defined as a valve current relative relationship and $S_{VT1}$, $S_{VT2}$, $S_{VT3}$, $S_{VT4}$, $S_{VT5}$ and $S_{VT6}$ according to the following formula:

$$S_{VTm} = \frac{i_{HVTm}}{i_{base}} \quad (4)$$

where m=1、2、3、4、5、6, and $S_{VTm}$ represents the valve current relative relationship $S_{VT1}$, $S_{VT2}$, $S_{VT3}$, $S_{VT4}$, $S_{VT5}$ and $S_{VT6}$.

S32. According to the step S31, a valve current duty cycle of the valve current relative relationship $S_{VTm}$ is calculated through a single-phase comparator, and the valve current duty cycle being greater than K is defined as the valve conducting state $S_{HVTm}$ according to the following formula:

$$S_{HVTm} = S_{VTm}; S_{VTm} > K \quad (5)$$

where m=1、2、3、4、5、6, $S_{HVTm}$ is the valve conducting state, and K is a critical value considering calculation errors.

S33. According to the step S32, a valve conduction time interval of the valve conducting state in each power frequency cycle is calculated with an integrator according to the following formula:

$$t_{HVTm} = \int_{-T}^{0} S_{HVTm} dt \quad (6)$$

where m=1、2、3、4、5、6, $t_{HVTm}$ is the valve conduction time interval, and T is the time interval of a power frequency cycle.

S4. According to the steps S2 and S3, time intervals of valve conducting states of the valve $VT_1$, the valve $VT_2$, the valve $VT_3$, the valve $VT_4$, the valve $VT_5$, and the valve $VT_6$ are compared with a time interval of a valve conducting state in normal operation, and whether the valve state is normal is determined and an abnormal valve is located according to a result of comparison.

This step S4 specifically includes the following steps:

S41. During normal operation, six valves ($VT_1$, $VT_2$, $VT_3$, $VT_4$, $VT_5$, and $VT_6$) of the three-phase are triggered to conduct in turn at 60° equal phase intervals, and according to the steps S2 and S3, a time interval of each valve conducting state in normal operation is calculated according to the following formula:

$$t_{HVT\_normal} = \frac{T}{3} \quad (7)$$

where $t_{HVT\_normal}$ is the valve conduction time interval in normal operation.

S42. The actual valve conduction time interval calculated in the step S33 is compared with the valve conduction time interval in normal operation to determine whether each valve conducting state is abnormal according to the following formula:

$$\begin{cases} |t_{HVT_m} - t_{HVT\_normal}| \le \varepsilon; \text{ normal} \\ |t_{HVT_m} - t_{HVT\_normal}| \le \varepsilon; \text{ abnormal} \end{cases} \quad (8)$$

where m=1、2、3、4、5、6, and ε represents a sampling measurement error.

Figure 4:
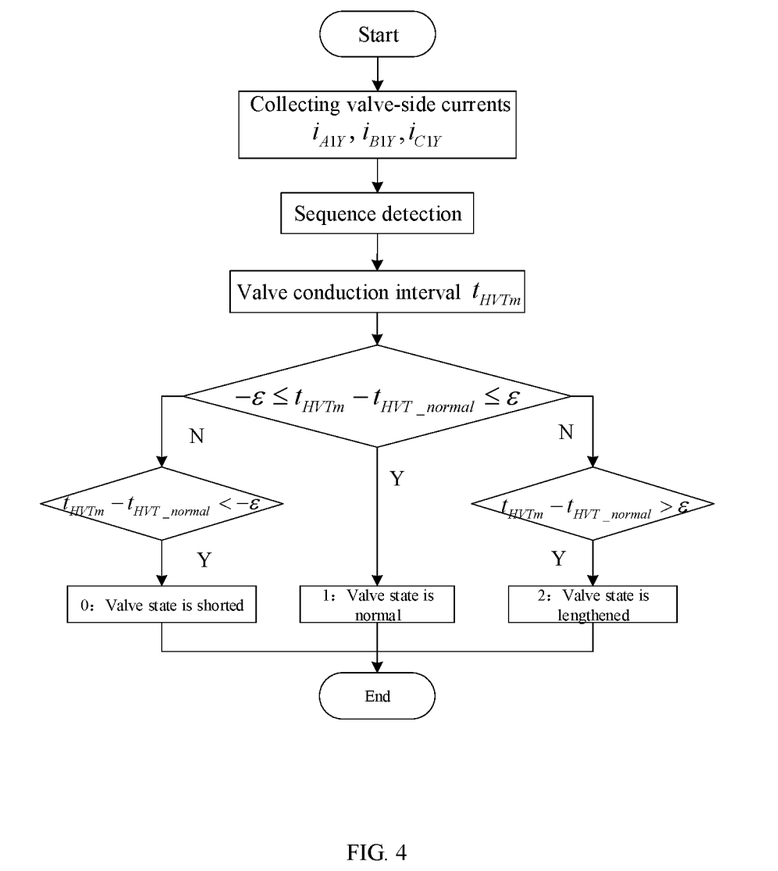
FIG. 4 is a flow chart of a DC converter valve state detection method based on temporal features of converter terminal currents according to the present invention, which is used to judge valve states and locating abnormal valves, where $t_{HVTm}$ represents the valve conduction time interval, m=1、2、3、4、5、6, and $\varepsilon$ represents a sampling measurement error.

S43. An abnormal valve is located according to an output state from the valve conduction time interval $t_{HVTm}$ through a range comparator according to the following formula. The valve state detection and positioning flowchart is as shown in FIG. 4;

$$CS_{HVTm} = \begin{cases} 2; t_{HVT_m} - t_{HVT\_normal} > \varepsilon \\ 1; -\varepsilon \le t_{HVT_m} - t_{HVT\_normal} \le \varepsilon \\ 0; t_{HVT_m} - t_{HVT\_normal} < -\varepsilon \end{cases} \quad (9)$$

where m=1、2、3、4、5、6, ε represents a sampling measurement error, $cs_{HVTm}$ represents a valve state signal, 2 represents that the valve conducting state is lengthened, 1 represents that the valve conducting state is normal, and 0 represents that the valve conducting state is shortened.

Embodiment II

According to the DC converter valve state detection method based on temporal features of converter terminal currents in embodiment I, the calculation is carried out in an actual power grid project, and the present invention is further described in detail.

Figure 5:
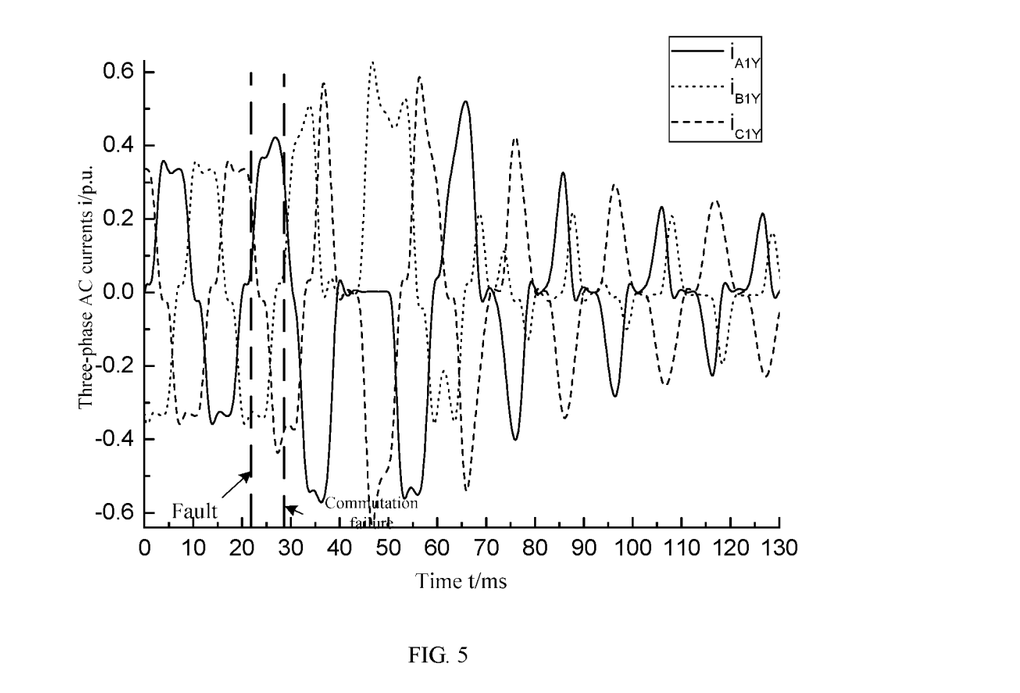
FIG. 5 is a schematic diagram of three-phase AC currents collected by a current transformer according to the present invention, in which $i_{A1Y}$, $i_{B1Y}$ and $i_{C1Y}$ represents three-phase AC currents on the valve-side.

A current transformer collects three-phase AC currents $i_{A1Y}$, $i_{B1Y}$ and $i_{C1Y}$ on a converter valve-side, and the waveforms are as shown in FIG. 5.

Figure 6:
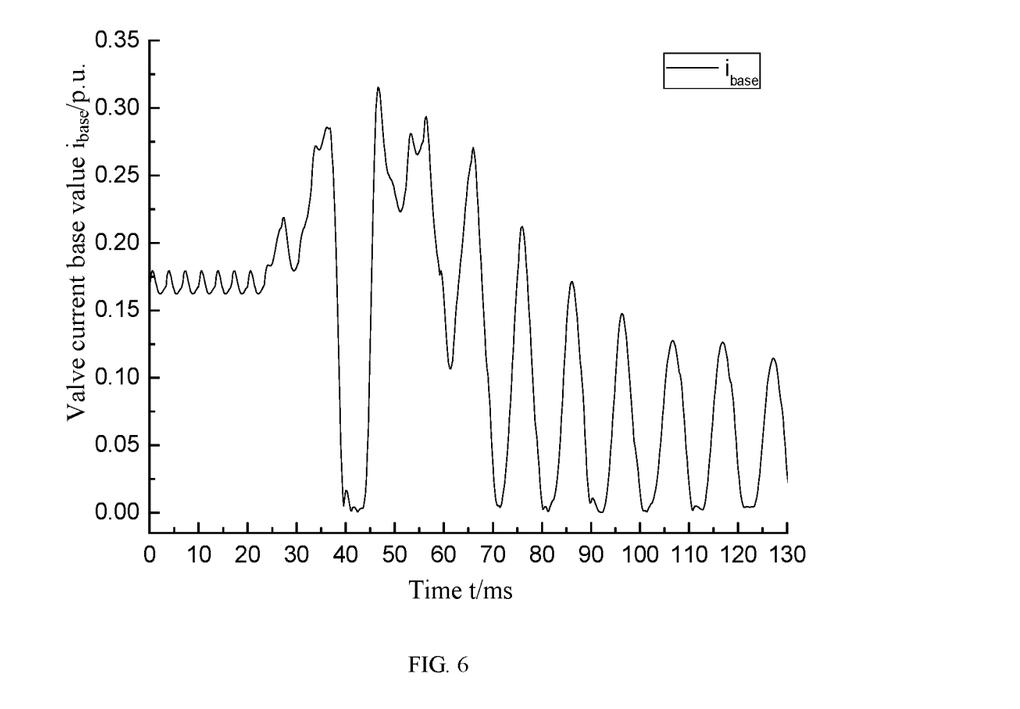
FIG. 6 is a schematic diagram of a valve current base value according to the present invention, in which $i_{base}$ represents the valve current base value.

According to the amplitude information of the three-phase AC currents $i_{A1Y}$, $i_{B1Y}$ and $i_{C1Y}$ in FIG. 5, 6 valve currents $i_{VT1}$, $i_{VT2}$, $i_{VT3}$, $i_{VT4}$, $i_{VT5}$ and $i_{VT6}$ are obtained, and a valve current base value is defined, as shown in FIG. 6. The valve current being greater than the valve current base value is defined as a valve conducting current.

Figure 7:
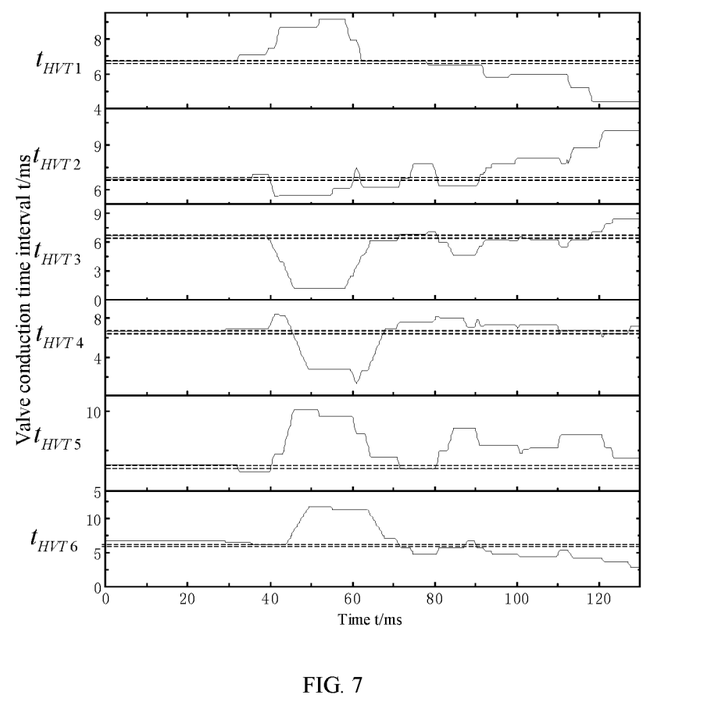
FIG. 7 is a schematic diagram of a time interval signal by simulation output of sequence detection according to the present invention, in which $t_{HVT1}$, $t_{HVT2}$, $t_{HVT3}$, $t_{HVT4}$, $t_{HVT5}$, and $t_{HVT6}$ represent valve conduction time interval output signals, and an area between the dotted lines represents the valve conduction time interval $t_{HVT\_normal}$ in normal operation.

Sequence detection is defined, and the logic is as follows: a valve current relative relationship is constructed through a ratio of the valve conducting current to the valve current base value, a duty cycle of the valve current relative relationship being greater than a threshold is defined as a valve conducting state, and the valve conducting state is integrated within one cycle to construct a valve conduction time interval, as shown in FIG. 7.

Figure 8:
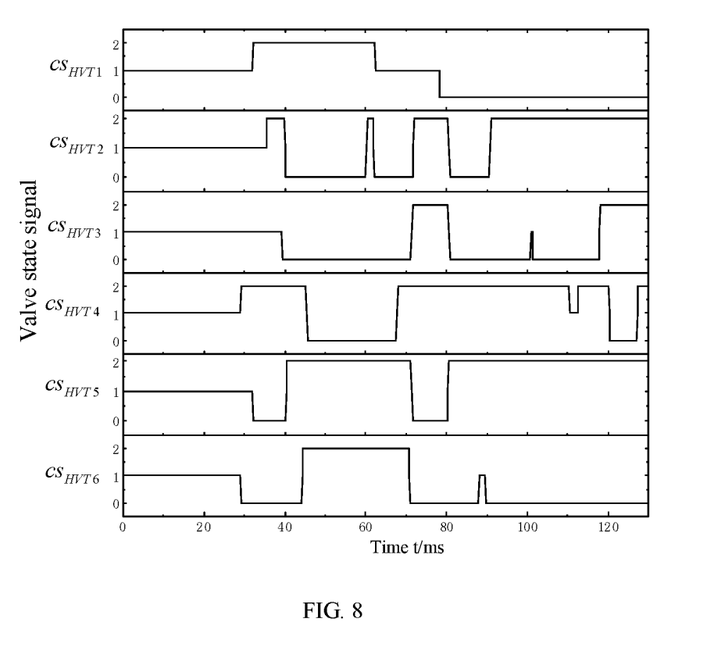
FIG. 8 is a schematic diagram of a valve state signal by simulation output of sequence detection according to the present invention, in which $cs_{HVT1}$, $cs_{HVT2}$, $cs_{HVT3}$, $cs_{HVT4}$, $cs_{HVT5}$ and $cs_{HVT6}$ represent valve state signals, 2 represents that the valve state is lengthened, 1 represents that the valve state is normal, and 0 represents that the valve state is shortened.

According to the comparison between the valve conduction time interval and the valve conduction time interval in normal operation, a valve state signal $cs_{HVTm}$ is obtained to detect whether the valve state is abnormal, and an abnormal valve is located. $cs_{HVTm}=2$ represents that the valve conducting state is lengthened, $cs_{HVTm}=1$ represents that the valve conducting state is normal, and $cs_{HVTm}=0$ represents that the valve conducting state is shortened, as shown in FIG. 8.

In summary, the above embodiments provide a DC converter valve state detection method based on temporal features of converter terminal currents, which is targeted to accurately detect valve conducting states and locate abnormal valves, providing a good support for accurate judgment of DC control protection.

The above embodiments are preferred embodiments of the present invention, but the embodiments of the present invention are not limited by the above embodiments, and any other changes, modifications, substitutions, combinations, simplifications, etc. made without departing from the spirit and principle of the present invention all should be equivalent replacement methods, and they are all included in the protection scope of the present invention.

What is claimed is:

1. A DC converter valve state detection method based on temporal features of converter terminal currents, comprising the following steps:

S1. defining a HVDC transmission converter valve model, comprising a valve $VT_1$, a valve $VT_2$, a valve $VT_3$, a valve $VT_4$, a valve $VT_5$, and a valve $VT_6$, wherein the valve $VT_1$ and the valve $VT_4$ are connected in series to form a first branch, the valve $VT_3$ and the valve $VT_6$ are connected in series to form a second branch, the valve $VT_5$ and the valve $VT_2$ are connected in series to form a third branch, and the first, second, and third branches are connected in parallel, and wherein a connecting point between the valve $VT_1$ and the valve $VT_4$ in the first branch is defined as an a-phase measuring point of three-phase AC currents, a connecting point between the valve $VT_3$ and the valve $VT_6$ in the second branch is defined as a b-phase measuring point of the three-phase AC currents, a connecting point between the valve $VT_5$ and the valve $VT_2$ in the third branch is defined as a c-phase measuring point of the three-phase AC currents, and three-phase AC currents $i_a$, $i_b$, and $i_c$ on a converter valve-side of a DC transmission system are collected, where $i_a$, $i_b$, and $i_c$ represent an a-phase, a b-phase, and a c-phase of the three-phase AC currents respectively;

S2. defining a current when the currents of two commutating valves are equal as a base value, greater than the base value as a valve conducting current, and less than the base value as a valve blocking current;

S3. defining sequence detection as follows: a valve current relative relationship is constructed by a ratio of the valve conducting current to the valve current base value, a duty cycle of the valve current relative relationship being greater than a threshold is defined as a valve conducting state, and the valve conducting state is integrated within one cycle to construct a valve conduction time interval; and S4. according to the steps S2 and S3, comparing time intervals of valve conducting states of the valve $VT_1$, the valve $VT_2$, the valve $VT_3$, the valve $VT_4$, the valve $VT_5$, and the valve $VT_6$ with a time interval of a valve conducting state in normal operation, and determining whether the valve state is normal and locating an abnormal valve according to a result of comparison.

2. The DC converter valve state detection method based on temporal features of converter terminal currents according to claim 1, wherein the step S2 comprises:

S21. obtaining valve currents $i_{VT1}$, $i_{VT2}$, $i_{VT3}$, $i_{VT4}$, $i_{VT5}$ and $i_{VT6}$ of the valve $VT_1$, the valve $VT_2$, the valve $VT_3$, the valve $VT_4$, the valve $VT_5$, and the valve $VT_6$ by calculating absolute values of the three-phase AC currents $i_a$, $i_b$, and $i_c$ according to the following formula:

$$\begin{cases} i_{VT1} = |i_a|; i_a < 0 \\ i_{VT2} = |i_c|; i_c > 0 \\ i_{VT3} = |i_b|; i_b < 0 \\ i_{VT4} = |i_a|; i_a > 0 \\ i_{VT5} = |i_c|; i_c < 0 \\ i_{VT6} = |i_b|; i_b > 0 \end{cases} \quad (1)$$

where $i_{VT1}$ is the valve current of the valve $VT_1$, $i_{VT2}$ is the valve current of the valve $VT_2$, $i_{VT3}$ is the valve current of the valve $VT_3$, $i_{VT4}$ is the valve current of the valve $VT_4$, $i_{VT5}$ is the valve current of the valve $VT_5$, and $i_{VT6}$ is the valve current of the valve $VT_6$;

S22. calculating a maximum value of the absolute values of the three-phase AC currents $i_a$, $i_b$ and $i_c$ as the valve current base value according to the following formula:

$$i_{base} = \frac{\max(|i_a|, |i_b|, |i_c|)}{2} \quad (2)$$

where $i_{base}$ presents the valve current base value, $|i_a|$, $|i_b|$ and $|i_c|$ represent the absolute values of the three-phase AC currents, and $\max(|i_a|,|i_b|,|i_c|)$ represents the maximum value of the absolute values of the three-phase AC currents; and S23. defining the valve current being greater than the valve current base value as the valve conducting current according to the following formula:

$$i_{HVTm} = i_{VTm}; i_{VTm} \geq i_{base} \quad (3)$$

where m=1、2、3、4、5、6, and $i_{HVTm}$ represents the valve conducting current.

3. The DC converter valve state detection method based on temporal features of converter terminal currents according to claim 1, wherein the step S3 comprises:

S31. defining a ratio of the valve conducting current to the valve current base value as a valve current relative relationship $S_{VT1}$, $S_{VT2}$, $S_{VT3}$, $S_{VT4}$, $S_{VT5}$ and $S_{VT6}$ according to the following formula:

$$S_{VTm} = \frac{i_{HVTm}}{i_{base}} \quad (4)$$

where $S_{VTm}$ represents the valve current relative relationship $S_{VT1}$, $S_{VT2}$, $S_{VT3}$, $S_{VT4}$, $S_{VT5}$ and $S_{VT6}$, m=1、2、3、4、5、6 $i_{HVTm}$ represents the valve conducting current, and $i_{base}$ represents the valve current base value;

S32. calculating a valve current duty cycle of the valve current relative relationship $S_{VTm}$ through a single-phase comparator, and defining the valve current duty cycle being greater than K as the valve conducting state $S_{VTm}$ according to the following formula:

$$S_{HVTm} = S_{VTm}; S_{VTm} > K \quad (5)$$

where $S_{HVTm}$ is the valve conducting state, and K is a critical value considering calculation errors; and S33. according to the step S32, calculating a valve conduction time interval of the valve conducting state in each power frequency cycle with an integrator according to the following formula:

$$t_{HVTm} = \int_{-T}^{0} S_{HVTm} dt \quad (6)$$

where $t_{HVTm}$ is the valve conduction time interval, and T is the time interval of a power frequency cycle.

4. The DC converter valve state detection method based on temporal features of converter terminal currents according to claim 1, wherein the step S4 comprises:

S41. during normal operation, triggering the valve $VT_1$, the valve $VT_2$, the valve $VT_3$, the valve $VT_4$, the valve $VT_5$, and the valve $VT_6$ of the three-phase to conduct in turn at 60° equal phase intervals, and according to the steps S2 and S3, calculating a time interval of each valve conducting state in normal operation according to the following formula:

$$t_{HVT\_normal} = \frac{T}{3} \quad (7)$$

where $t_{HVT\_normal}$ is the valve conduction time interval in normal operation, and T is the time interval of a power frequency cycle;

S42. comparing the valve conduction time interval $t_{HVTm}$ calculated in the step S33 with the valve conduction time interval $t_{HVT\_normal}$ in normal operation to determine whether each valve conducting state is abnormal according to the following formula:

$$\begin{cases} |t_{HVTm} - t_{HVT\_normal}| \leq \varepsilon; & \text{normal} \\ |t_{HVTm} - t_{HVT\_normal}| > \varepsilon; & \text{abnormal} \end{cases} \quad (8)$$

where $\varepsilon$ represents a sampling measurement error; and

S43. locating an abnormal valve according to an output state from the valve conduction time interval through a range comparator according to the following formula:

$$CS_{HVTm} = \begin{cases} 2; t_{HVTm} - t_{HVT\_normal} > \varepsilon \\ 1; -\varepsilon \leq t_{HVTm} - t_{HVT\_normal} \leq \varepsilon \\ 0; t_{HVTm} - t_{HVT\_normal} < -\varepsilon \end{cases} \quad (9)$$

where $cs_{HVTm}$ represents a valve state signal, 2 represents that the valve conducting state is lengthened, 1 represents that the valve conducting state is normal, and 0 represents that the valve conducting state is shortened.

* * * * *